(12) United States Patent
Salter et al.

(10) Patent No.: US 9,184,745 B2
(45) Date of Patent: Nov. 10, 2015

(54) PROXIMITY SWITCH ASSEMBLY AND METHOD OF SENSING USER INPUT BASED ON SIGNAL RATE OF CHANGE

(75) Inventors: Stuart C. Salter, White Lake, MI (US); Pietro Buttolo, Dearborn Heights, MI (US); Cornel Lewis Gardner, Romulus, MI (US); Thomas Lee Goodson, Battle Creek, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 830 days.

(21) Appl. No.: 13/444,409

(22) Filed: Apr. 11, 2012

(65) Prior Publication Data

US 2013/0271203 A1     Oct. 17, 2013

(51) Int. Cl.
*H03K 17/945*     (2006.01)
*H03K 17/94*      (2006.01)
*H03K 17/955*     (2006.01)

(52) U.S. Cl.
CPC .............. *H03K 17/94* (2013.01); *H03K 17/955* (2013.01)

(58) Field of Classification Search
CPC ....................................................... H03K 17/94
See application file for complete search history.

(56) References Cited

U.S. PATENT DOCUMENTS

| | | |
|---|---|---|
| 3,382,588 A | 5/1968 | Serrell et al. |
| 3,544,804 A | 12/1970 | Gaumer et al. |
| 3,691,396 A | 9/1972 | Hinrichs |
| 3,707,671 A | 12/1972 | Morrow et al. |
| 3,725,589 A | 4/1973 | Golden |
| 3,826,979 A | 7/1974 | Steinmann |
| 4,204,204 A | 5/1980 | Pitstick |
| 4,205,325 A | 5/1980 | Haygood et al. |
| 4,232,289 A | 11/1980 | Daniel |
| 4,257,117 A | 3/1981 | Besson |
| 4,290,052 A | 9/1981 | Eichelberger et al. |
| 4,340,813 A | 7/1982 | Sauer |
| 4,374,381 A | 2/1983 | Ng et al. |

(Continued)

FOREIGN PATENT DOCUMENTS

| | | |
|---|---|---|
| DE | 4024052 | 1/1992 |
| EP | 1152443 | 11/2001 |

(Continued)

OTHER PUBLICATIONS

Van Ess, Dave et al., "Capacitive Touch Switches for Automotive Applications," 7 pages, Published in Automotive DesignLine, www.automotiedesignline.com, Feb. 2006.

(Continued)

*Primary Examiner* — Jared Fureman
*Assistant Examiner* — Joel Barnett
(74) *Attorney, Agent, or Firm* — Vichit Chea; Price Heneveld LLP

(57) ABSTRACT

A proximity switch assembly and method for detecting activation of a proximity switch assembly is provided. The assembly includes a plurality of proximity switches each having a proximity sensor providing a sense activation field and control circuitry processing the activation field of each proximity switch to sense activation. The assembly and method detects a signal associated with each proximity switch, determines a rate of change of the signal associated with the first switch and a rate of change of the signal associated with a neighboring second switch and determines whether to activate the first switch based on at least one of the first rate of signal change and second rate of signal change.

17 Claims, 7 Drawing Sheets

(56) References Cited

U.S. PATENT DOCUMENTS

| | | |
|---|---|---|
| 4,377,049 A | 3/1983 | Simon et al. |
| 4,380,040 A | 4/1983 | Posset |
| 4,413,252 A | 11/1983 | Tyler et al. |
| 4,431,882 A | 2/1984 | Frame |
| 4,446,380 A | 5/1984 | Moriya et al. |
| 4,453,112 A | 6/1984 | Sauer et al. |
| 4,492,958 A | 1/1985 | Minami |
| 4,494,105 A | 1/1985 | House |
| 4,502,726 A | 3/1985 | Adams |
| 4,514,817 A | 4/1985 | Pepper et al. |
| 4,613,802 A | 9/1986 | Kraus et al. |
| 4,680,429 A | 7/1987 | Murdock et al. |
| 4,743,895 A | 5/1988 | Alexander |
| 4,748,390 A | 5/1988 | Okushima et al. |
| 4,758,735 A | 7/1988 | Ingraham |
| 4,821,029 A | 4/1989 | Logan et al. |
| 4,855,550 A | 8/1989 | Schultz, Jr. |
| 4,872,485 A | 10/1989 | Laverty, Jr. |
| 4,899,138 A | 2/1990 | Araki et al. |
| 4,901,074 A | 2/1990 | Sinn et al. |
| 4,905,001 A | 2/1990 | Penner |
| 4,924,222 A | 5/1990 | Antikidis et al. |
| 4,972,070 A | 11/1990 | Laverty, Jr. |
| 5,025,516 A | 6/1991 | Wilson |
| 5,033,508 A | 7/1991 | Laverty, Jr. |
| 5,036,321 A | 7/1991 | Leach et al. |
| 5,050,634 A | 9/1991 | Fiechtner |
| 5,063,306 A | 11/1991 | Edwards |
| 5,108,530 A | 4/1992 | Niebling, Jr. et al. |
| 5,153,590 A | 10/1992 | Charlier |
| 5,159,159 A | 10/1992 | Asher |
| 5,159,276 A | 10/1992 | Reddy, III |
| 5,177,341 A | 1/1993 | Balderson |
| 5,212,621 A | 5/1993 | Panter |
| 5,215,811 A | 6/1993 | Reafler et al. |
| 5,239,152 A | 8/1993 | Caldwell et al. |
| 5,270,710 A | 12/1993 | Gaultier et al. |
| 5,294,889 A | 3/1994 | Heep et al. |
| 5,329,239 A | 7/1994 | Kindermann et al. |
| 5,341,231 A | 8/1994 | Yamamoto et al. |
| 5,403,980 A | 4/1995 | Eckrich |
| 5,451,724 A | 9/1995 | Nakazawa et al. |
| 5,467,080 A | 11/1995 | Stoll et al. |
| 5,477,422 A | 12/1995 | Hooker et al. |
| 5,494,180 A | 2/1996 | Callahan |
| 5,512,836 A | 4/1996 | Chen et al. |
| 5,526,294 A | 6/1996 | Ono et al. |
| 5,548,268 A | 8/1996 | Collins |
| 5,566,702 A | 10/1996 | Philipp |
| 5,572,205 A | 11/1996 | Caldwell et al. |
| 5,586,042 A | 12/1996 | Pisau et al. |
| 5,594,222 A | 1/1997 | Caldwell |
| 5,598,527 A | 1/1997 | Debrus et al. |
| 5,670,886 A | 9/1997 | Wolff et al. |
| 5,681,515 A | 10/1997 | Pratt et al. |
| 5,730,165 A | 3/1998 | Philipp |
| 5,747,756 A | 5/1998 | Boedecker |
| 5,760,554 A | 6/1998 | Bustamante |
| 5,790,107 A | 8/1998 | Kasser et al. |
| 5,796,183 A | 8/1998 | Hourmand |
| 5,825,352 A | 10/1998 | Bisset et al. |
| 5,827,980 A | 10/1998 | Doemens et al. |
| 5,864,105 A | 1/1999 | Andrews |
| 5,867,111 A | 2/1999 | Caldwell et al. |
| 5,874,672 A | 2/1999 | Gerardi et al. |
| 5,880,538 A | 3/1999 | Schulz |
| 5,917,165 A | 6/1999 | Platt et al. |
| 5,920,309 A | 7/1999 | Bisset et al. |
| 5,942,733 A | 8/1999 | Allen et al. |
| 5,963,000 A | 10/1999 | Tsutsumi et al. |
| 5,973,417 A | 10/1999 | Goetz et al. |
| 5,973,623 A | 10/1999 | Gupta et al. |
| 6,010,742 A | 1/2000 | Tanabe et al. |
| 6,011,602 A | 1/2000 | Miyashita et al. |
| 6,031,465 A | 2/2000 | Burgess |
| 6,035,180 A | 3/2000 | Kubes et al. |
| 6,037,930 A | 3/2000 | Wolfe et al. |
| 6,040,534 A | 3/2000 | Beukema |
| 6,157,372 A | 12/2000 | Blackburn et al. |
| 6,172,666 B1 | 1/2001 | Okura |
| 6,215,476 B1 | 4/2001 | Depew et al. |
| 6,219,253 B1 | 4/2001 | Green |
| 6,231,111 B1 | 5/2001 | Carter et al. |
| 6,275,644 B1 | 8/2001 | Domas et al. |
| 6,288,707 B1 | 9/2001 | Philipp |
| 6,292,100 B1 | 9/2001 | Dowling |
| 6,310,611 B1 | 10/2001 | Caldwell |
| 6,320,282 B1 | 11/2001 | Caldwell |
| 6,323,919 B1 | 11/2001 | Yang et al. |
| 6,369,369 B2 | 4/2002 | Kochman et al. |
| 6,377,009 B1 | 4/2002 | Philipp |
| 6,379,017 B2 | 4/2002 | Nakabayashi et al. |
| 6,380,931 B1 | 4/2002 | Gillespie et al. |
| 6,404,158 B1 | 6/2002 | Boisvert et al. |
| 6,415,138 B2 | 7/2002 | Sirola et al. |
| 6,427,540 B1 | 8/2002 | Monroe et al. |
| 6,452,138 B1 | 9/2002 | Kochman et al. |
| 6,452,514 B1 | 9/2002 | Philipp |
| 6,456,027 B1 | 9/2002 | Pruessel |
| 6,457,355 B1 | 10/2002 | Philipp |
| 6,464,381 B2 | 10/2002 | Anderson, Jr. et al. |
| 6,466,036 B1 | 10/2002 | Philipp |
| 6,485,595 B1 | 11/2002 | Yenni, Jr. et al. |
| 6,529,125 B1 | 3/2003 | Butler et al. |
| 6,535,200 B2 | 3/2003 | Philipp |
| 6,535,694 B2 | 3/2003 | Engle et al. |
| 6,537,359 B1 | 3/2003 | Spa |
| 6,538,579 B1 | 3/2003 | Yoshikawa et al. |
| 6,559,902 B1 | 5/2003 | Kusuda et al. |
| 6,587,097 B1 | 7/2003 | Aufderheide et al. |
| 6,603,306 B1 | 8/2003 | Olsson et al. |
| 6,607,413 B2 | 8/2003 | Stevenson et al. |
| 6,614,579 B2 | 9/2003 | Roberts et al. |
| 6,617,975 B1 | 9/2003 | Burgess |
| 6,639,159 B2 | 10/2003 | Anzai |
| 6,646,398 B1 | 11/2003 | Fukazawa et al. |
| 6,652,777 B2 | 11/2003 | Rapp et al. |
| 6,654,006 B2 | 11/2003 | Kawashima et al. |
| 6,661,410 B2 | 12/2003 | Casebolt et al. |
| 6,664,489 B2 | 12/2003 | Kleinhans et al. |
| 6,713,897 B2 | 3/2004 | Caldwell |
| 6,734,377 B2 | 5/2004 | Gremm et al. |
| 6,738,051 B2 | 5/2004 | Boyd et al. |
| 6,740,416 B1 | 5/2004 | Yokogawa et al. |
| 6,756,970 B2 | 6/2004 | Keely, Jr. et al. |
| 6,773,129 B2 | 8/2004 | Anderson, Jr. et al. |
| 6,774,505 B1 | 8/2004 | Wnuk |
| 6,794,728 B1 | 9/2004 | Kithil |
| 6,795,226 B2 | 9/2004 | Agrawal et al. |
| 6,809,280 B2 | 10/2004 | Divigalpitiya et al. |
| 6,812,424 B2 | 11/2004 | Miyako |
| 6,819,316 B2 | 11/2004 | Schulz et al. |
| 6,819,990 B2 | 11/2004 | Ichinose |
| 6,825,752 B2 | 11/2004 | Nahata et al. |
| 6,834,373 B2 | 12/2004 | Dieberger |
| 6,841,748 B2 | 1/2005 | Serizawa et al. |
| 6,847,018 B2 | 1/2005 | Wong |
| 6,847,289 B2 | 1/2005 | Pang et al. |
| 6,854,870 B2 | 2/2005 | Huizenga |
| 6,879,250 B2 | 4/2005 | Fayt et al. |
| 6,884,936 B2 | 4/2005 | Takahashi et al. |
| 6,891,114 B2 | 5/2005 | Peterson |
| 6,891,530 B2 | 5/2005 | Umemoto et al. |
| 6,897,390 B2 | 5/2005 | Caldwell et al. |
| 6,929,900 B2 | 8/2005 | Farquhar et al. |
| 6,930,672 B1 | 8/2005 | Kuribayashi |
| 6,940,291 B1 | 9/2005 | Ozick |
| 6,960,735 B2 | 11/2005 | Hein et al. |
| 6,962,436 B1 | 11/2005 | Holloway et al. |
| 6,964,023 B2 | 11/2005 | Maes et al. |
| 6,966,225 B1 | 11/2005 | Mallary |
| 6,967,587 B2 | 11/2005 | Snell et al. |
| 6,977,615 B2 | 12/2005 | Brandwein, Jr. |
| 6,987,605 B2 | 1/2006 | Liang et al. |

(56) References Cited

U.S. PATENT DOCUMENTS

| | | | |
|---|---|---|---|
| 6,993,607 B2 | 1/2006 | Philipp |
| 6,999,066 B2 | 2/2006 | Litwiller |
| 7,030,513 B2 | 4/2006 | Caldwell |
| 7,046,129 B2 | 5/2006 | Regnet et al. |
| 7,053,360 B2 | 5/2006 | Balp et al. |
| 7,063,379 B2 | 6/2006 | Steuer et al. |
| 7,091,836 B2 | 8/2006 | Kachouh et al. |
| 7,091,886 B2 | 8/2006 | DePue et al. |
| 7,098,414 B2 | 8/2006 | Caldwell |
| 7,105,752 B2 | 9/2006 | Tsai et al. |
| 7,106,171 B1 | 9/2006 | Burgess |
| 7,135,995 B2 | 11/2006 | Engelmann et al. |
| 7,146,024 B2 | 12/2006 | Benkley, III |
| 7,151,450 B2 | 12/2006 | Beggs et al. |
| 7,151,532 B2 | 12/2006 | Schulz |
| 7,154,481 B2 | 12/2006 | Cross et al. |
| 7,180,017 B2 | 2/2007 | Hein |
| 7,186,936 B2 | 3/2007 | Marcus et al. |
| 7,205,777 B2 | 4/2007 | Schulz et al. |
| 7,215,529 B2 | 5/2007 | Rosenau |
| 7,218,498 B2 | 5/2007 | Caldwell |
| 7,232,973 B2 | 6/2007 | Kaps et al. |
| 7,242,393 B2 | 7/2007 | Caldwell |
| 7,245,131 B2 | 7/2007 | Kurachi et al. |
| 7,248,151 B2 | 7/2007 | McCall |
| 7,248,955 B2 | 7/2007 | Hein et al. |
| 7,254,775 B2 * | 8/2007 | Geaghan et al. ............... 715/701 |
| 7,255,466 B2 | 8/2007 | Schmidt et al. |
| 7,255,622 B2 | 8/2007 | Stevenson et al. |
| 7,269,484 B2 | 9/2007 | Hein |
| 7,295,168 B2 | 11/2007 | Saegusa et al. |
| 7,295,904 B2 | 11/2007 | Kanevsky et al. |
| 7,339,579 B2 | 3/2008 | Richter et al. |
| 7,342,485 B2 | 3/2008 | Joehl et al. |
| 7,347,297 B2 | 3/2008 | Ide et al. |
| 7,355,595 B2 | 4/2008 | Bathiche et al. |
| 7,361,860 B2 | 4/2008 | Caldwell |
| 7,385,308 B2 | 6/2008 | Yerdon et al. |
| 7,445,350 B2 | 11/2008 | Konet et al. |
| 7,447,575 B2 | 11/2008 | Goldbeck et al. |
| 7,479,788 B2 | 1/2009 | Bolender et al. |
| 7,489,053 B2 | 2/2009 | Gentile et al. |
| 7,521,941 B2 | 4/2009 | Ely et al. |
| 7,521,942 B2 | 4/2009 | Reynolds |
| 7,531,921 B2 | 5/2009 | Cencur |
| 7,532,202 B2 | 5/2009 | Roberts |
| 7,535,131 B1 | 5/2009 | Safieh, Jr. |
| 7,535,459 B2 | 5/2009 | You et al. |
| 7,567,240 B2 | 7/2009 | Peterson, Jr. et al. |
| 7,583,092 B2 | 9/2009 | Reynolds et al. |
| 7,643,010 B2 | 1/2010 | Westerman et al. |
| 7,653,883 B2 | 1/2010 | Hotelling et al. |
| 7,688,080 B2 | 3/2010 | Golovchenko et al. |
| 7,701,440 B2 | 4/2010 | Harley |
| 7,705,257 B2 | 4/2010 | Arione et al. |
| 7,708,120 B2 | 5/2010 | Einbinder |
| 7,710,245 B2 | 5/2010 | Pickering |
| 7,714,846 B1 | 5/2010 | Gray |
| 7,719,142 B2 | 5/2010 | Hein et al. |
| 7,728,819 B2 | 6/2010 | Inokawa |
| 7,737,953 B2 | 6/2010 | Mackey |
| 7,737,956 B2 | 6/2010 | Hsieh et al. |
| 7,777,732 B2 | 8/2010 | Herz et al. |
| 7,782,307 B2 | 8/2010 | Westerman et al. |
| 7,791,594 B2 | 9/2010 | Dunko |
| 7,795,882 B2 | 9/2010 | Kirchner et al. |
| 7,800,590 B2 | 9/2010 | Satoh et al. |
| 7,821,425 B2 | 10/2010 | Philipp |
| 7,834,853 B2 | 11/2010 | Finney et al. |
| 7,839,392 B2 | 11/2010 | Pak et al. |
| 7,876,310 B2 | 1/2011 | Westerman et al. |
| 7,881,940 B2 | 2/2011 | Dusterhoff |
| RE42,199 E | 3/2011 | Caldwell |
| 7,898,531 B2 | 3/2011 | Bowden et al. |
| 7,920,131 B2 | 4/2011 | Westerman |
| 7,924,143 B2 | 4/2011 | Griffin et al. |
| 7,957,864 B2 | 6/2011 | Lenneman et al. |
| 7,977,596 B2 | 7/2011 | Born et al. |
| 7,978,181 B2 | 7/2011 | Westerman |
| 7,989,752 B2 | 8/2011 | Yokozawa |
| 8,026,904 B2 | 9/2011 | Westerman |
| 8,050,876 B2 | 11/2011 | Feen et al. |
| 8,054,296 B2 | 11/2011 | Land et al. |
| 8,054,300 B2 | 11/2011 | Bernstein |
| 8,077,154 B2 | 12/2011 | Emig et al. |
| 8,090,497 B2 | 1/2012 | Ando |
| 8,253,425 B2 | 8/2012 | Reynolds et al. |
| 8,283,800 B2 | 10/2012 | Salter et al. |
| 8,330,385 B2 | 12/2012 | Salter et al. |
| 8,339,286 B2 | 12/2012 | Cordeiro |
| 8,386,027 B2 | 2/2013 | Chuang et al. |
| 8,454,181 B2 | 6/2013 | Salter et al. |
| 8,456,180 B2 * | 6/2013 | Sitarski ..................... 324/679 |
| 8,508,487 B2 | 8/2013 | Schwesig et al. |
| 8,517,383 B2 | 8/2013 | Wallace et al. |
| 8,537,107 B1 | 9/2013 | Li |
| 8,570,053 B1 | 10/2013 | Ryshtun et al. |
| 8,659,414 B1 | 2/2014 | Schuk |
| 8,908,034 B2 | 12/2014 | Bordonaro |
| 8,933,708 B2 | 1/2015 | Buttolo et al. |
| 8,981,265 B2 | 3/2015 | Jiao et al. |
| 2001/0019228 A1 | 9/2001 | Gremm |
| 2001/0028558 A1 | 10/2001 | Rapp et al. |
| 2002/0040266 A1 | 4/2002 | Edgar et al. |
| 2002/0084721 A1 | 7/2002 | Walczak |
| 2002/0093786 A1 | 7/2002 | Maser |
| 2002/0149376 A1 | 10/2002 | Haffner et al. |
| 2002/0167439 A1 | 11/2002 | Bloch et al. |
| 2002/0167704 A1 | 11/2002 | Kleinhans et al. |
| 2003/0002273 A1 | 1/2003 | Anderson, Jr. et al. |
| 2003/0101781 A1 | 6/2003 | Budzynski et al. |
| 2003/0122554 A1 | 7/2003 | Karray et al. |
| 2003/0128116 A1 | 7/2003 | Ieda et al. |
| 2003/0189211 A1 | 10/2003 | Dietz |
| 2004/0056753 A1 | 3/2004 | Chiang et al. |
| 2004/0090195 A1 | 5/2004 | Motsenbocker |
| 2004/0145613 A1 | 7/2004 | Stavely et al. |
| 2004/0160072 A1 | 8/2004 | Carter et al. |
| 2004/0160234 A1 | 8/2004 | Denen et al. |
| 2004/0160713 A1 | 8/2004 | Wei |
| 2004/0197547 A1 | 10/2004 | Bristow et al. |
| 2004/0246239 A1 | 12/2004 | Knowles et al. |
| 2005/0012484 A1 | 1/2005 | Gifford et al. |
| 2005/0052429 A1 | 3/2005 | Philipp |
| 2005/0068045 A1 | 3/2005 | Inaba et al. |
| 2005/0068712 A1 | 3/2005 | Schulz et al. |
| 2005/0073425 A1 | 4/2005 | Snell et al. |
| 2005/0088417 A1 | 4/2005 | Mulligan |
| 2005/0092097 A1 | 5/2005 | Shank et al. |
| 2005/0110769 A1 | 5/2005 | DaCosta et al. |
| 2005/0137765 A1 | 6/2005 | Hein et al. |
| 2005/0242923 A1 | 11/2005 | Pearson et al. |
| 2005/0275567 A1 | 12/2005 | DePue et al. |
| 2006/0022682 A1 | 2/2006 | Nakamura et al. |
| 2006/0038793 A1 | 2/2006 | Philipp |
| 2006/0044800 A1 | 3/2006 | Reime |
| 2006/0055553 A1 | 3/2006 | Yeh |
| 2006/0082545 A1 | 4/2006 | Choquet et al. |
| 2006/0170241 A1 | 8/2006 | Yamashita |
| 2006/0238518 A1 | 10/2006 | Westerman et al. |
| 2006/0238521 A1 | 10/2006 | Westerman et al. |
| 2006/0244733 A1 | 11/2006 | Geaghan |
| 2006/0250142 A1 | 11/2006 | Abe |
| 2006/0262549 A1 | 11/2006 | Schmidt et al. |
| 2006/0267953 A1 | 11/2006 | Peterson, Jr. et al. |
| 2006/0279015 A1 | 12/2006 | Wang |
| 2006/0287474 A1 | 12/2006 | Crawford et al. |
| 2007/0008726 A1 | 1/2007 | Brown |
| 2007/0023265 A1 | 2/2007 | Ishikawa et al. |
| 2007/0051609 A1 | 3/2007 | Parkinson |
| 2007/0068790 A1 | 3/2007 | Yerdon et al. |
| 2007/0096565 A1 | 5/2007 | Breed et al. |
| 2007/0103431 A1 | 5/2007 | Tabatowski-Bush |
| 2007/0206668 A1 | 9/2007 | Jin |

(56) References Cited

U.S. PATENT DOCUMENTS

| | | |
|---|---|---|
| 2007/0226994 A1 | 10/2007 | Wollach et al. |
| 2007/0232779 A1 | 10/2007 | Moody et al. |
| 2007/0247429 A1 | 10/2007 | Westerman |
| 2007/0255468 A1 | 11/2007 | Strebel et al. |
| 2007/0257891 A1 | 11/2007 | Esenther et al. |
| 2007/0271072 A1 | 11/2007 | Kovacevich |
| 2007/0296709 A1 | 12/2007 | GuangHai |
| 2008/0012835 A1 | 1/2008 | Rimon et al. |
| 2008/0018604 A1 | 1/2008 | Paun et al. |
| 2008/0023715 A1 | 1/2008 | Choi |
| 2008/0030465 A1 | 2/2008 | Konet et al. |
| 2008/0074398 A1 | 3/2008 | Wright |
| 2008/0111714 A1 | 5/2008 | Kremin |
| 2008/0136792 A1 | 6/2008 | Peng et al. |
| 2008/0142352 A1 | 6/2008 | Wright |
| 2008/0143681 A1 | 6/2008 | XiaoPing |
| 2008/0150905 A1 | 6/2008 | Grivna et al. |
| 2008/0158146 A1 | 7/2008 | Westerman |
| 2008/0196945 A1 | 8/2008 | Konstas |
| 2008/0202912 A1 | 8/2008 | Boddie et al. |
| 2008/0231290 A1 | 9/2008 | Zhitomirsky |
| 2008/0238650 A1 | 10/2008 | Riihimaki et al. |
| 2008/0246723 A1 | 10/2008 | Baumbach |
| 2008/0257706 A1 | 10/2008 | Haag |
| 2008/0272623 A1 | 11/2008 | Kadzban et al. |
| 2009/0066659 A1 | 3/2009 | He et al. |
| 2009/0079699 A1 | 3/2009 | Sun |
| 2009/0108985 A1 | 4/2009 | Haag et al. |
| 2009/0115731 A1 | 5/2009 | Rak |
| 2009/0120697 A1 | 5/2009 | Wilner et al. |
| 2009/0135157 A1 | 5/2009 | Harley |
| 2009/0212849 A1 | 8/2009 | Reime |
| 2009/0225043 A1 | 9/2009 | Rosener |
| 2009/0235588 A1 | 9/2009 | Patterson et al. |
| 2009/0236210 A1 | 9/2009 | Clark et al. |
| 2009/0251435 A1 | 10/2009 | Westerman et al. |
| 2009/0256578 A1 | 10/2009 | Wuerstlein et al. |
| 2009/0256677 A1 | 10/2009 | Hein et al. |
| 2009/0273563 A1 | 11/2009 | Pryor |
| 2009/0295409 A1 | 12/2009 | Irkliy |
| 2009/0295556 A1 | 12/2009 | Inoue et al. |
| 2009/0309616 A1 | 12/2009 | Klinghult et al. |
| 2010/0001746 A1 | 1/2010 | Duchene et al. |
| 2010/0001974 A1 | 1/2010 | Su et al. |
| 2010/0007613 A1 | 1/2010 | Costa |
| 2010/0007620 A1 | 1/2010 | Hsieh et al. |
| 2010/0013777 A1 | 1/2010 | Baudisch et al. |
| 2010/0026654 A1 | 2/2010 | Suddreth |
| 2010/0039392 A1 | 2/2010 | Pratt et al. |
| 2010/0066391 A1 | 3/2010 | Hirasaka et al. |
| 2010/0090712 A1 | 4/2010 | Vandermeijden |
| 2010/0090966 A1 | 4/2010 | Gregorio |
| 2010/0102830 A1 | 4/2010 | Curtis et al. |
| 2010/0103139 A1 | 4/2010 | Soo et al. |
| 2010/0110037 A1 | 5/2010 | Huang et al. |
| 2010/0117970 A1 | 5/2010 | Burstrom et al. |
| 2010/0125393 A1 | 5/2010 | Jarvinen et al. |
| 2010/0156814 A1 | 6/2010 | Weber et al. |
| 2010/0177057 A1 | 7/2010 | Flint et al. |
| 2010/0188356 A1 | 7/2010 | Vu et al. |
| 2010/0188364 A1 | 7/2010 | Lin et al. |
| 2010/0194692 A1 | 8/2010 | Orr et al. |
| 2010/0207907 A1 | 8/2010 | Tanabe et al. |
| 2010/0212819 A1 | 8/2010 | Salter et al. |
| 2010/0214253 A1* | 8/2010 | Wu et al. .................. 345/174 |
| 2010/0219935 A1 | 9/2010 | Bingle et al. |
| 2010/0241431 A1 | 9/2010 | Weng et al. |
| 2010/0241983 A1 | 9/2010 | Walline et al. |
| 2010/0245286 A1 | 9/2010 | Parker |
| 2010/0250071 A1 | 9/2010 | Pala et al. |
| 2010/0252048 A1 | 10/2010 | Young et al. |
| 2010/0277431 A1 | 11/2010 | Klinghult |
| 2010/0280983 A1 | 11/2010 | Cho et al. |
| 2010/0286867 A1 | 11/2010 | Bergholz et al. |
| 2010/0289754 A1 | 11/2010 | Sleeman et al. |
| 2010/0289759 A1 | 11/2010 | Fisher et al. |
| 2010/0296303 A1 | 11/2010 | Sarioglu et al. |
| 2010/0302200 A1* | 12/2010 | Netherton et al. ............ 345/174 |
| 2010/0315267 A1 | 12/2010 | Chung et al. |
| 2010/0321214 A1 | 12/2010 | Wang et al. |
| 2010/0321321 A1 | 12/2010 | Shenfield et al. |
| 2010/0321335 A1 | 12/2010 | Lim et al. |
| 2010/0328261 A1 | 12/2010 | Woolley et al. |
| 2010/0328262 A1 | 12/2010 | Huang et al. |
| 2011/0001707 A1 | 1/2011 | Faubert et al. |
| 2011/0001722 A1 | 1/2011 | Newman et al. |
| 2011/0007021 A1 | 1/2011 | Bernstein et al. |
| 2011/0007023 A1 | 1/2011 | Abrahamsson et al. |
| 2011/0012623 A1 | 1/2011 | Gastel et al. |
| 2011/0018744 A1 | 1/2011 | Philipp |
| 2011/0018817 A1 | 1/2011 | Kryze et al. |
| 2011/0022393 A1 | 1/2011 | Waller et al. |
| 2011/0031983 A1 | 2/2011 | David et al. |
| 2011/0034219 A1 | 2/2011 | Filson et al. |
| 2011/0037725 A1 | 2/2011 | Pryor |
| 2011/0037735 A1 | 2/2011 | Land et al. |
| 2011/0039602 A1 | 2/2011 | McNamara et al. |
| 2011/0041409 A1 | 2/2011 | Newman et al. |
| 2011/0043481 A1 | 2/2011 | Bruwer |
| 2011/0050251 A1 | 3/2011 | Franke et al. |
| 2011/0050587 A1 | 3/2011 | Natanzon et al. |
| 2011/0050618 A1 | 3/2011 | Murphy et al. |
| 2011/0050620 A1 | 3/2011 | Hristov |
| 2011/0055753 A1 | 3/2011 | Horodezky et al. |
| 2011/0057899 A1 | 3/2011 | Sleeman et al. |
| 2011/0062969 A1 | 3/2011 | Hargreaves et al. |
| 2011/0063425 A1 | 3/2011 | Tieman |
| 2011/0074573 A1 | 3/2011 | Seshadri |
| 2011/0080365 A1 | 4/2011 | Westerman |
| 2011/0080366 A1 | 4/2011 | Bolender |
| 2011/0080376 A1 | 4/2011 | Kuo et al. |
| 2011/0082616 A1 | 4/2011 | Small et al. |
| 2011/0083110 A1 | 4/2011 | Griffin et al. |
| 2011/0095997 A1 | 4/2011 | Philipp |
| 2011/0115732 A1 | 5/2011 | Coni et al. |
| 2011/0115742 A1 | 5/2011 | Sobel et al. |
| 2011/0134047 A1 | 6/2011 | Wigdor et al. |
| 2011/0134054 A1 | 6/2011 | Woo et al. |
| 2011/0141006 A1 | 6/2011 | Rabu |
| 2011/0141041 A1 | 6/2011 | Parkinson et al. |
| 2011/0148803 A1 | 6/2011 | Xu |
| 2011/0157037 A1 | 6/2011 | Shamir et al. |
| 2011/0157079 A1 | 6/2011 | Wu et al. |
| 2011/0157080 A1 | 6/2011 | Ciesla et al. |
| 2011/0157089 A1 | 6/2011 | Rainisto |
| 2011/0161001 A1 | 6/2011 | Fink |
| 2011/0163764 A1 | 7/2011 | Shank et al. |
| 2011/0169758 A1 | 7/2011 | Aono |
| 2011/0187492 A1 | 8/2011 | Newman et al. |
| 2011/0210755 A1 | 9/2011 | Ogawa |
| 2011/0279276 A1 | 11/2011 | Newham |
| 2011/0279409 A1 | 11/2011 | Salaverry et al. |
| 2011/0309912 A1 | 12/2011 | Muller |
| 2012/0007821 A1 | 1/2012 | Zaliva |
| 2012/0037485 A1 | 2/2012 | Sitarski |
| 2012/0043973 A1 | 2/2012 | Kremin |
| 2012/0043976 A1 | 2/2012 | Bokma et al. |
| 2012/0049870 A1 | 3/2012 | Salter et al. |
| 2012/0055557 A1 | 3/2012 | Belz et al. |
| 2012/0062247 A1 | 3/2012 | Chang |
| 2012/0062498 A1 | 3/2012 | Weaver et al. |
| 2012/0068956 A1 | 3/2012 | Jira et al. |
| 2012/0104790 A1 | 5/2012 | Plavetich et al. |
| 2012/0154324 A1 | 6/2012 | Wright et al. |
| 2012/0217147 A1 | 8/2012 | Porter et al. |
| 2012/0312676 A1 | 12/2012 | Salter et al. |
| 2012/0313648 A1 | 12/2012 | Salter et al. |
| 2012/0313767 A1 | 12/2012 | Sitarski |
| 2012/0319992 A1 | 12/2012 | Lee |
| 2013/0024169 A1 | 1/2013 | Veerasamy |
| 2013/0033356 A1 | 2/2013 | Sitarski et al. |
| 2013/0036529 A1 | 2/2013 | Salter et al. |
| 2013/0076121 A1 | 3/2013 | Salter et al. |
| 2013/0093500 A1 | 4/2013 | Bruwer |

(56) References Cited

U.S. PATENT DOCUMENTS

| | | |
|---|---|---|
| 2013/0106436 A1 | 5/2013 | Brunet et al. |
| 2013/0113397 A1 | 5/2013 | Salter et al. |
| 2013/0113544 A1 | 5/2013 | Salter et al. |
| 2013/0126325 A1 | 5/2013 | Curtis et al. |
| 2013/0170013 A1 | 7/2013 | Tonar et al. |
| 2013/0270896 A1 | 10/2013 | Buttolo et al. |
| 2013/0270899 A1 | 10/2013 | Buttolo et al. |
| 2013/0271157 A1 | 10/2013 | Buttolo et al. |
| 2013/0271159 A1 | 10/2013 | Santos et al. |
| 2013/0271182 A1 | 10/2013 | Buttolo et al. |
| 2013/0271202 A1 | 10/2013 | Buttolo et al. |
| 2013/0271204 A1 | 10/2013 | Salter et al. |
| 2013/0291439 A1 | 11/2013 | Wuerstlein et al. |
| 2013/0307610 A1 | 11/2013 | Salter et al. |
| 2013/0321065 A1 | 12/2013 | Salter et al. |
| 2013/0328616 A1 | 12/2013 | Buttolo et al. |
| 2014/0002405 A1 | 1/2014 | Salter et al. |
| 2014/0145733 A1 | 5/2014 | Buttolo et al. |
| 2014/0252879 A1 | 9/2014 | Dassanayake et al. |
| 2014/0306723 A1 | 10/2014 | Salter et al. |
| 2014/0306724 A1 | 10/2014 | Dassanayake et al. |
| 2015/0077227 A1 | 3/2015 | Salter et al. |
| 2015/0180471 A1 | 6/2015 | Buttolo et al. |

FOREIGN PATENT DOCUMENTS

| | | |
|---|---|---|
| EP | 1327860 | 7/2003 |
| EP | 1562293 | 8/2005 |
| EP | 2133777 | 10/2011 |
| EP | 2133777 B1 | 10/2011 |
| GB | 2071338 | 9/1981 |
| GB | 2158737 | 11/1985 |
| GB | 2279750 | 1/1995 |
| GB | 2409578 | 6/2005 |
| GB | 2418741 | 4/2006 |
| JP | 61188515 | 8/1986 |
| JP | 4065038 | 3/1992 |
| JP | 04082416 | 3/1992 |
| JP | 07315880 | 12/1995 |
| JP | 08138446 | 5/1996 |
| JP | 11065764 | 3/1999 |
| JP | 11110131 | 4/1999 |
| JP | 11260133 | 9/1999 |
| JP | 11316553 | 11/1999 |
| JP | 2000047178 | 2/2000 |
| JP | 2000075293 | 3/2000 |
| JP | 2001013868 | 1/2001 |
| JP | 2006007764 | 1/2006 |
| JP | 2007027034 | 2/2007 |
| JP | 2008033701 | 2/2008 |
| JP | 2010139362 | 6/2010 |
| JP | 2010165618 | 7/2010 |
| JP | 2010218422 A | 9/2010 |
| JP | 2010239587 | 10/2010 |
| JP | 2010287148 | 12/2010 |
| JP | 2011014280 | 1/2011 |
| KR | 20040110463 | 12/2004 |
| KR | 20090127544 | 12/2009 |
| KR | 20100114768 | 10/2010 |
| KR | 101258376 | 4/2013 |
| WO | 9636960 | 11/1996 |
| WO | 9963394 | 12/1999 |
| WO | 2006093398 | 9/2006 |
| WO | 2007022027 | 2/2007 |
| WO | 2008121760 | 10/2008 |
| WO | 2009054592 | 4/2009 |
| WO | 2010111362 | 9/2010 |
| WO | 2012032318 | 3/2012 |
| WO | 2012032318 A1 | 3/2012 |
| WO | 2012169106 | 12/2012 |
| WO | 2012169106 A1 | 12/2012 |

OTHER PUBLICATIONS

"Introduction to Touch Solutions, White Paper, Rivision 1.0 A," Densitron Corporation, 14 pages, Aug. 21, 2007.

Kliffken, Marksu G. et al., "Obstacle Detection for Power Operated Window-Lift and Sunroof Actuation Systems," Paper No. 2001-01-0466, 1 page, © 2011 SAE International, Published Mar. 5, 2001.

NXP Capacitive Sensors, 1 page, www.nxp.com, copyrighted 2006-2010, NXP Semiconductors.

"Moisture Immunity in QuickSense Studio," AN552, Rev. 0.1 Oct. 2010, 8 pages, Silicon Laboratories, Inc., © 2010.

"Touch Sensors Design Guide" by ATMEL, 10620 D-AT42-04/09, Revised Apr. 2009, 72 pages, Copyrighted 2008-2009 Atmel Corporation.

"Charge-Transfer Sensing-Based Touch Controls Facilitate Creative Interfaces," www.ferret.com.au, 2 pages, Jan. 18, 2006.

Kiosk Peripherals, "Touch Screen," www.bitsbytesintegrators.com/kiosk-peripherals.html, 10 pages, no date provided.

JVC KD-AVX777 Detachable Front-Panel with Integrated 5.4" Touch-Screen Monitor, 6 pages, www.crutchfield.com, no date provided.

Ergonomic Palm Buttons, Pepperl+Fuchs, www.wolfautomation.com, 6 pages, no date provided.

"Clevios P Formulation Guide," 12 pages, www.clevios.com, Heraeus Clevios GmbH, no date provided.

"Orgacon EL-P3000, Screen printing Ink Series 3000," 2 pages, AGFA, last updated in Feb. 2006.

U.S. Appl. No. 14/518,141, filed Oct. 20, 2014, entitled "Directional Proximity Switch Assemby," (23 pages of specification and 13 pages of drawings) and Official Filing Receipt (3 pages).

U.S. Appl. No. 14/552,809, filed Nov. 25, 2014, entitled "Proximity Switch Based Door Latch Release," (14 pages of specification and 4 pages of drawings) and Official Filing Receipt (3 pages).

U.S. Appl. No. 14/314,328, filed Jun. 25, 2014, entitled "Proximity Switch Assembly Having Pliable Surface and Depression," (43 pages of specification and 24 pages of drawings) and Official Filing Receipt (3 pages).

U.S. Appl. No. 14/314,364, filed Jun. 25, 2014, entitled "Proximity Switch Assembly Having Groove Between Adjacent Proximity Sensors," (43 pages of specification and 24 pages of drawings) and Official Filing Receipt (3 pages).

U.S. Appl. No. 13/609,390, filed Sep. 11, 2012, entitled "Proximity Switch Based Door Latch Release," (14 pages of specification and 4 pages of drawings) and Official Filing Receipt (3 pages).

U.S. Appl. No. 13/665,253, filed Oct. 31, 2012, entitled Proximity Switch Assembly Having Round Layer, (15 pages of specification and 7 pages of drawings) and Official Filing Receipt (3 pages).

U.S. Appl. No. 13/799,413, filed Mar. 13, 2013, entitled "Proximity Interface Development System Having Replicator and Method," (29 pages of specification and 20 pages of drawings) and Official Filing Receipt (3 pages).

U.S. Appl. No. 13/799,478, filed Mar. 13, 2013, entitled "Proximity Interface Development System Having Analyzer and Method," (29 pages of specification and 20 pages of drawings) and Official Filing Receipt (3 pages).

U.S. Appl. No. 14/168,614, filed Jan. 30, 2014, entitled "Proximity Switch Assembly and Activation Method Having Virtual Button Mode," (30 pages of specification and 15 pages of drawings) and Official Filing Receipt (3 pages).

U.S. Appl. No. 14/635,140, filed Mar. 2, 2015, entitled "Proximity Switch Having Wrong Touch Adaptive Learning and Method," (20 pages of specification and 7 pages of drawings) and Official Filing Receipt (3 pages).

U.S. Appl. No. 14/661,325, filed Mar. 18, 2015, entitled "Proximity Switch Assembly Having Haptic Feedback and Method," (31 pages of specification and 15 pages of drawings) and Official Filing Receipt (3 pages).

U.S. Appl. No. 14/717,031, filed May 20, 2015, entitled "Proximity Sensor Assembly Having Interleaved Electrode Configuration," (38 pages of specification and 21 pages of drawings) and Official Filing Receipt (3 pages).

U.S. Appl. No. 14/689,324, filed Apr. 17, 2015, entitled "Proximity Switch Assembly With Signal Drift Rejection and Method," (35 pages of specification and 17 pages of drawings) and Official Filing Receipt (3 pages).

* cited by examiner

PROXIMITY SWITCH ASSEMBLY AND METHOD OF SENSING USER INPUT BASED ON SIGNAL RATE OF CHANGE

FIELD OF THE INVENTION

The present invention generally relates to switches, and more particularly relates to proximity switches having an enhanced determination of switch activation.

BACKGROUND OF THE INVENTION

Automotive vehicles are typically equipped with various user actuatable switches, such as switches for operating devices including powered windows, headlights, windshield wipers, moonroofs or sunroofs, interior lighting, radio and infotainment devices, and various other devices. Generally, these types of switches need to be actuated by a user in order to activate or deactivate a device or perform some type of control function. Proximity switches, such as capacitive switches, employ one or more proximity sensors to generate a sense activation field and sense changes to the activation field indicative of user actuation of the switch, typically caused by a user's finger in close proximity or contact with the sensor. Capacitive switches are typically configured to detect user actuation of the switch based on comparison of the sense activation field to a threshold.

Switch assemblies often employ a plurality of capacitive switches in close proximity to one another and generally require that a user select a single desired capacitive switch to perform the intended operation. In some applications, such as use in an automobile, the driver of the vehicle has limited ability to view the switches due to driver distraction. In such applications, it is desirable to allow the user to explore the switch assembly for a specific button while avoiding a premature determination of switch activation. Thus, it is desirable to discriminate whether the user intends to activate a switch, or is simply exploring for a specific switch button while focusing on a higher priority task, such as driving, or has no intent to activate a switch. Accordingly, it is desirable to provide for a proximity switch arrangement which enhances the use of proximity switches by a person, such as a driver of a vehicle.

SUMMARY OF THE INVENTION

According to one aspect of the present invention, a method of activating a proximity switch is provided. The method includes the step of detecting a first signal associated with a first proximity switch and a second signal associated with a neighboring second proximity switch. The method also includes the step of determining a first rate of change of the first signal and a second rate of change of the second signal. The method further includes the step of activating the first switch based on at least one of the first rate of signal change and the second rate of change.

According to another aspect of the present invention, a method of activating a proximity switch is provided. The method includes the steps of detecting a first signal associated with a first proximity switch and a second signal associated with a neighboring second proximity switch. The method also includes the step of determining a rate of change of the second signal. The method further includes the step of activating the first switch based on the first signal and the rate of change of the second signal.

According to a further aspect of the present invention, a proximity switch assembly is provided. The proximity switch assembly includes a plurality of proximity switches each comprising a proximity sensor for providing a sense activation field. The proximity switch assembly also includes control circuitry processing the activation field of each proximity switch, detecting a first signal associated with a first proximity switch and a second signal associated with a neighboring second proximity switch, determining a first rate of change of the first signal and second rate of change of the second signal, and determining whether to activate the first switch based on at least one of the first rate of signal change and the second rate of signal change.

These and other aspects, objects, and features of the present invention will be understood and appreciated by those skilled in the art upon studying the following specification, claims, and appended drawings.

DETAILED DESCRIPTION OF THE PREFERRED EMBODIMENTS

As required, detailed embodiments of the present invention are disclosed herein; however, it is to be understood that the disclosed embodiments are merely exemplary of the invention that may be embodied in various and alternative forms. The figures are not necessarily to a detailed design; some schematics may be exaggerated or minimized to show function overview. Therefore, specific structural and functional details disclosed herein are not to be interpreted as limiting, but merely as a representative basis for teaching one skilled in the art to variously employ the present invention.

Figure 1:
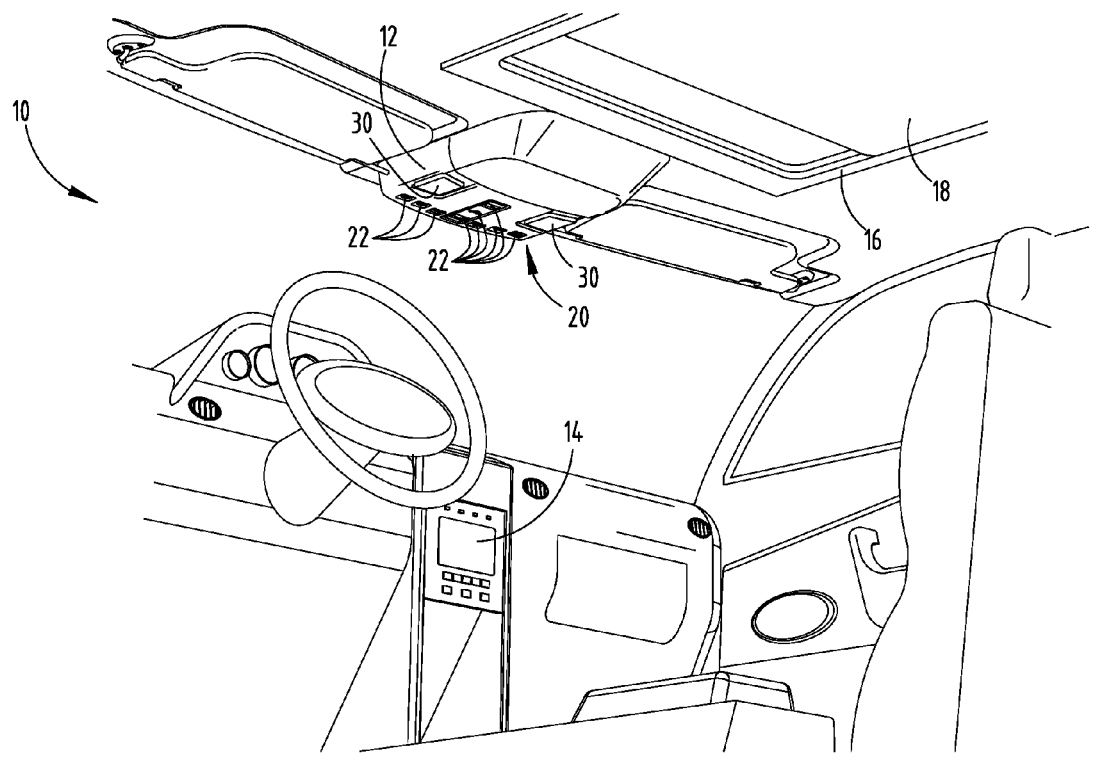
FIG. 1 is a perspective view of a passenger compartment of an automotive vehicle having an overhead console employing a proximity switch assembly, according to one embodiment.
Figure 2:
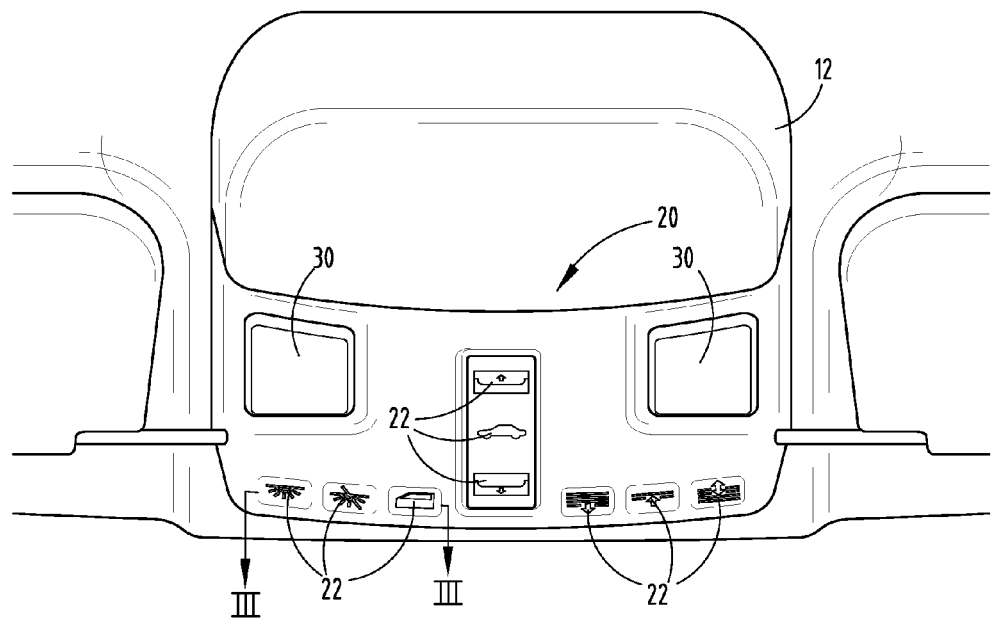
FIG. 2 is an enlarged view of the overhead console and proximity switch assembly shown in FIG. 1.

Referring to FIGS. 1 and 2, the interior of an automotive vehicle 10 is generally illustrated having a passenger compartment and a switch assembly 20 employing a plurality of proximity switches 22 having switch activation monitoring and determination, according to one embodiment. The vehicle 10 generally includes an overhead console 12 assembled to the headliner on the underside of the roof or ceiling at the top of the vehicle passenger compartment, generally above the front passenger seating area. The switch assembly 20 has a plurality of proximity switches 22 arranged close to one another in the overhead console 12, according to one embodiment. The various proximity switches 22 may control any of a number of vehicle devices and functions, such as controlling movement of a sunroof or moonroof 16, controlling movement of a moonroof shade 18, controlling activation of one or more lighting devices such as interior map/reading and dome lights 30, and various other devices and functions. However, it should be appreciated that the proximity switches 22 may be located elsewhere on the vehicle 10, such as in the dash panel, on other consoles such as a center console, integrated into a touch screen display 14 for a radio or infotainment system such as a navigation and/or audio display, or located elsewhere onboard the vehicle 10 according to various vehicle applications.

The proximity switches 22 are shown and described herein as capacitive switches, according to one embodiment. Each proximity switch 22 includes at least one proximity sensor that provides a sense activation field to sense contact or close proximity (e.g., within one millimeter) of a user in relation to the one or more proximity sensors, such as a swiping motion by a user's finger. Thus, the sense activation field of each proximity switch 22 is a capacitive field in the exemplary embodiment and the user's finger has electrical conductivity and dielectric properties that cause a change or disturbance in the sense activation field as should be evident to those skilled in the art. However, it should also be appreciated by those skilled in the art that additional or alternative types of proximity sensors can be used, such as, but not limited to, inductive sensors, optical sensors, temperatures sensors, resistive sensors, the like, or a combination thereof. Exemplary proximity sensors are described in the Apr. 9, 2009, ATMEL® Touch Sensors Design Guide, 10620 D-AT42-04/09, the entire reference hereby being incorporated herein by reference.

The proximity switches 22 shown in FIGS. 1 and 2 each provide control of a vehicle component or device or provide a designated control function. One or more of the proximity switches 22 may be dedicated to controlling movement of a sunroof or moonroof 16 so as to cause the moonroof 16 to move in an open or closed direction, tilt the moonroof, or stop movement of the moonroof based upon a control algorithm. One or more other proximity switches 22 may be dedicated to controlling movement of a moonroof shade 18 between open and closed positions. Each of the moonroof 16 and shade 18 may be actuated by an electric motor in response to actuation of the corresponding proximity switch 22. Other proximity switches 22 may be dedicated to controlling other devices, such as turning an interior map/reading light 30 on, turning an interior map/reading light 30 off, turning a dome lamp on or off, unlocking a trunk, opening a rear hatch, or defeating a door light switch. Additional controls via the proximity switches 22 may include actuating door power windows up and down. Various other vehicle controls may be controlled by way of the proximity switches 22 described herein.

Figure 3:
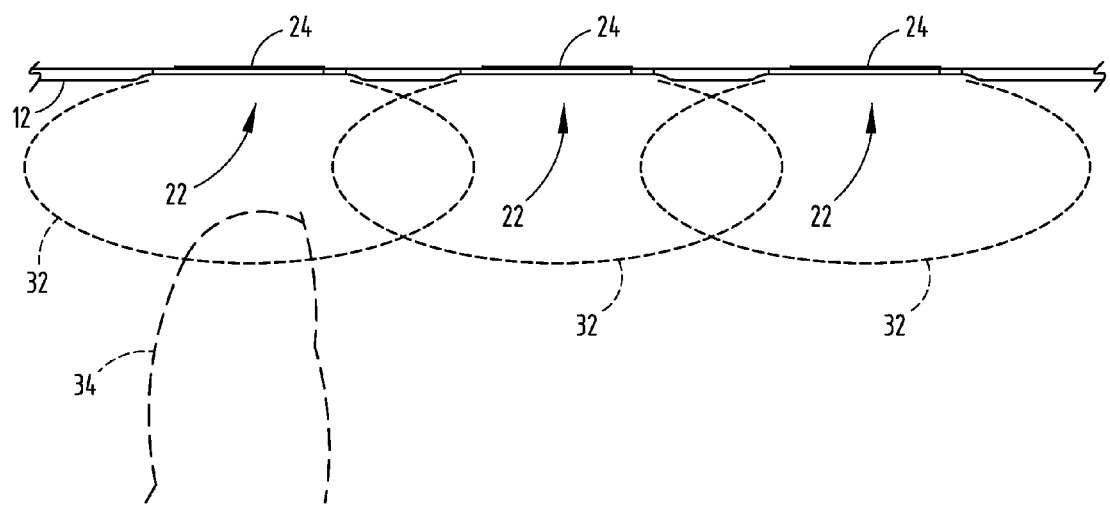
FIG. 3 is an enlarged cross-sectional view taken through line III-III in FIG. 2 showing an array of proximity switches in relation to a user's finger.
Figure 4:
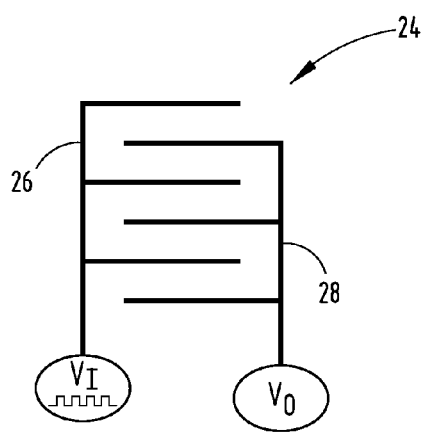
FIG. 4 is a schematic diagram of a capacitive sensor employed in each of the capacitive switches shown in FIG. 3.

Referring to FIG. 3, a portion of the proximity switch assembly 20 is illustrated having an array of three serially arranged proximity switches 22 in close relation to one another in relation to a user's finger 34 during use of the switch assembly 20. The middle proximity switch 22 has neighboring proximity switches 22 on both the left and right sides. Each proximity switch 22 includes one or more proximity sensors 24 for generating a sense activation field. According to one embodiment, each of the proximity sensors 24 may be formed by printing conductive ink onto the top surface of the polymeric overhead console 12. One example of a printed ink proximity sensor 24 is shown in FIG. 4 generally having a drive electrode 26 and a receive electrode 28 each having interdigitated fingers for generating a capacitive field 32. It should be appreciated that each of the proximity sensors 24 may be otherwise formed such as by assembling a preformed conductive circuit trace onto a substrate according to other embodiments. The drive electrode 26 receives square wave drive pulses applied at voltage $V_I$. The receive electrode 28 has an output for generating an output voltage $V_O$. It should be appreciated that the electrodes 26 and 28 may be arranged in various other configurations for generating the capacitive field as the activation field 32.

In the embodiment shown and described herein, the drive electrode 26 of each proximity sensor 24 is applied with voltage input $V_I$ as square wave pulses having a charge pulse cycle sufficient to charge the receive electrode 28 to a desired voltage. The receive electrode 28 thereby serve as a measurement electrode. In the embodiment shown, adjacent sense activation fields 32 generated by adjacent or neighboring proximity switches 22 overlap slightly, however, overlap may not exist according to other embodiments. When a user or operator, such as the user's finger 34, enters an activation field 32, the proximity switch assembly 20 detects the disturbance caused by the finger 34 to the activation field 32 and determines whether the disturbance is sufficient to activate the corresponding proximity switch 22. The disturbance of the activation field 32 is detected by processing the charge pulse signal associated with the corresponding signal channel. When the user's finger 34 contacts two activation fields 32, the proximity switch assembly 20 detects the disturbance of both contacted activation fields 32 via separate signal channels. Each proximity switch 22 has its own dedicated signal channel generating charge pulse counts which is processed as discussed herein.

Figure 5:
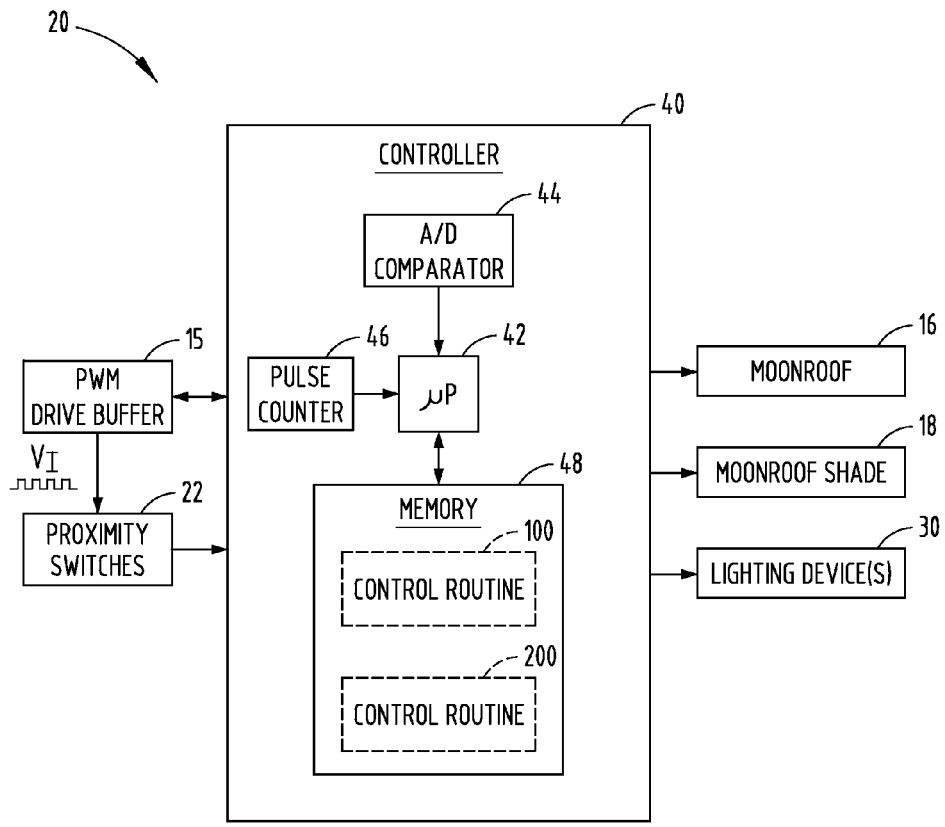
FIG. 5 is a block diagram illustrating the proximity switch assembly, according to one embodiment.

Referring to FIG. 5, the proximity switch assembly 20 is illustrated according to one embodiment. A plurality of proximity sensors 24 are shown providing inputs to a controller 40, such as a microcontroller. The controller 40 may include control circuitry, such as a microprocessor 42 and memory 48. The control circuitry may include sense control circuitry processing the activation field of each sensor 22 to sense user activation of the corresponding switch by comparing the activation field signal to one or more thresholds pursuant to one or more control routines. It should be appreciated that other analog and/or digital control circuitry may be employed to process each activation field, determine user activation, and initiate an action. The controller 40 may employ a QMatrix acquisition method available by ATMEL®, according to one embodiment. The ATMEL acquisition method employs a WINDOWS® host C/C++ compiler and debugger WinAVR to simplify development and testing the utility Hawkeye that allows monitoring in real-time the internal state of critical variables in the software as well as collecting logs of data for post-processing.

The controller 40 provides an output signal to one or more devices that are configured to perform dedicated actions responsive to detected activation of a proximity switch. For example, the one or more devices may include a moonroof 16 having a motor to move the moonroof panel between open and closed and tilt positions, a moonroof shade 18 that moves between open and closed positions, and lighting devices 30 that may be turned on and off. Other devices may be controlled such as a radio for performing on and off functions, volume control, scanning, and other types of devices for performing other dedicated functions. One of the proximity switches 22 may be dedicated to actuating the moonroof closed, another proximity switch 22 may be dedicated to actuating the moonroof open, and a further switch 22 may be dedicated to actuating the moonroof to a tilt position, all of which would cause a motor to move the moonroof to a desired position. The moonroof shade 18 may be opened in response to one proximity switch 22 and may be closed responsive to another proximity switch 22.

The controller 40 is further shown having an analog to digital (A/D) comparator 44 coupled to the microprocessor 42. The A/D comparator 44 receives the voltage output $V_O$ from each of the proximity switches 22, converts the analog signal to a digital signal, and provides the digital signal to the microprocessor 42. Additionally, controller 40 includes a pulse counter 46 coupled to the microprocessor 42. The pulse counter 46 counts the charge signal pulses that are applied to each drive electrode of each proximity sensor, performs a count of the pulses needed to charge the capacitor until the voltage output $V_O$ reaches a predetermined voltage, and provides the count to the microprocessor 42. The pulse count is indicative of the change in capacitance of the corresponding capacitive sensor. The controller 40 is further shown communicating with a pulse width modulated drive buffer 15. The controller 40 provides a pulse width modulated signal to the pulse width modulated drive buffer 15 to generate a square wave pulse train $V_I$ which is applied to each drive electrode of each proximity sensor/switch 22. The controller 40 processes one or more control routines, shown including control routines 100 and 200 stored in memory to monitor and make a determination as to activation of one of the proximity switches.

The control routines 100 and 200 process the plurality of proximity switches 22 and perform a method of sensing user input on the switches and activating the appropriate proximity switch associated with the proximity switch assembly 20. The method includes the steps of generating an activation field with each of a plurality of proximity sensors associated with a plurality of proximity switches, and detecting a signal associated with each of a plurality of proximity sensors associated with the proximity switches due to presence of a user. The method also detects a peak amplitude of a first signal associated with a first proximity switch and determines a rate of change of the first signal following the peak amplitude detection and a rate of change of a second signal associated with a neighboring second proximity switch. The method further determines whether to activate the first switch based on at least one of the rate of change of the first signal and rate of change of the second signal. The method further enters an exploration mode when the rate of change of the first signal and rate of change of the second signal are greater than a threshold. The method determines activation of the current signal channel when at least one of the rate of change of the first signal and the rate of change of the second signal is less than a threshold value. The method further sums the absolute value of rate of change of the first signal and absolute value of rate of change of the second signal, compares the summed value to a sum threshold value, and activates the current channel switch when the summed value is less than the sum threshold value. The rate of change of both the first signal and the second signal are determined during a time period following detection of the peak signal. The largest amplitude signal associated with the plurality of activation fields is processed to determine activation of one of the proximity sensors.

Figure 6:
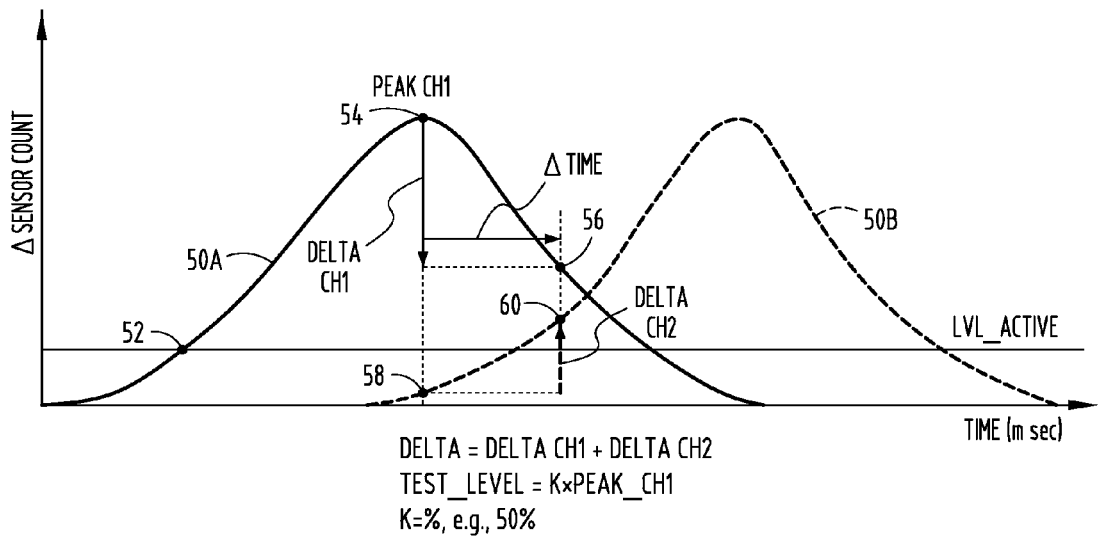
FIG. 6 is a graph illustrating the signal count for two signal channels associated with two neighboring capacitive sensors showing an activation motion profile.

Referring to FIG. 6, the change in sensor charge pulse counts shown as Δ Sensor Count for two signal channels associated with two neighboring (i.e., adjacent) proximity switches 22 shown in FIG. 3, is illustrated according to one example. The change in sensor charge pulse count is the difference between an initialized referenced count value without any finger or other object present in the activation field and the corresponding sensor reading. In this example, the user's finger enters the activation fields 32 associated with each of two neighboring proximity switches 22, generally one sense activation field at a time with overlap between adjacent activation fields 32 as the user's finger moves across the array of switches. Signal channel 1 shown by solid line 50A is the change (Δ) in sensor charge pulse count associated with a first capacitive sensor 24, and signal channel 2 shown by dashed line 50B is the change in sensor charge pulse count associated with the adjacent or neighboring second capacitive sensor 24. In the disclosed embodiment, the proximity sensors 24 are capacitive sensors. When a user's finger is in contact with or close proximity of a sensor 24, the finger alters the capacitance measured at the corresponding sensor 24. The capacitance is in parallel to the untouched sensor pad parasitic capacitance, and as such, measures as an offset. The user or operator induced capacitance is proportional to the user's finger or other body part dielectric constant, the surface exposed to the capacitive pad, and is inversely proportional to the distance of the user's limb to the switch button. According to one embodiment, each sensor is excited with a train of voltage pulses via pulse width modulation (PWM) electronics until the sensor is charged up to a set voltage potential. Such an acquisition method charges the receive electrode 28 to a known voltage potential. The cycle is repeated until the voltage across the measurement capacitor reaches a predetermined voltage. Placing a user's finger on the touch surface of the switch 24 introduces external capacitance that increases the amount of charge transferred each cycle, thereby reducing the total number of cycles required for the measurement capacitance to reach the predetermined voltage. The user's finger causes the change in sensor charge pulse count to increase since this value is based on the initialized reference count minus the sensor reading.

The proximity switch assembly 20 is able to recognize the user's hand motion when the hand, particularly a finger, is in close proximity to the proximity switches 22, to discriminate whether the intent of the user is to activate a switch 22, explore for a specific switch button while focusing on higher priority tasks, such as driving, or is the result of a task such as adjusting the rearview mirror that has nothing to do with actuation of a proximity switch 22. The proximity switch assembly 20 may operate in an exploration or hunting mode which enables the user to explore the touch sensor keypads or buttons of the switch assembly 20 by passing or sliding a finger in close proximity to the switches without triggering an activation of a switch until the user's intent is determined. The proximity switch assembly 20 monitors amplitude of a signal generated in response to the activation field for each switch, detects a peak signal associated with one of the switches, determines a rate of change of a first signal associated with a first switch following the peak detection, and a rate of change of a second signal associated with a neighboring second switch, and determines whether to activate the first switch based on at one of the rate of signal change of the first signal and rate of change of the second signal. The proximity switch assembly 20 further enters an exploration mode when the rate of change of the first signal and the rate of change of the second signal are greater than a threshold. As a result, exploration of the proximity switch assembly 20 is allowed, such that users are free to explore the switch interface pad with their fingers without inadvertently triggering an event, the interface response time is fast, activation happens based on rate of change in the signal(s), and inadvertent activation of the switch is prevented or reduced.

As shown in FIG. 3, as the user's finger 34 approaches a proximity switch 22 associated with signal channel 1, the finger 34 enters the activation field 32 associated with the sensor 24 which causes disruption to the capacitance, thereby resulting in a Δ sensor count increase as shown by signal 50A in the activation motion profile of FIG. 6. The proximity switch assembly monitors the current signal channel 50A of the first switch as well as signal channels of neighboring switches, such as second signal channel 50B, and determines whether the operator intends to press a button for activation of the current switch or explore the interface based on one or both of the rate of change of the first signal and a neighboring switch signal channel. The system and method monitors the first signal 50A to determine when the first signal 50A exceeds a level threshold (LVL_THRESHOLD) count indicative of an active signal channel having a Δ sensor count value indicative of activity on a sensor greater than noise. The first signal channel 50A crosses the LVL_ACTIVE threshold at point 52 and rises up to a peak signal at point 54.

The first signal 50A is shown decreasing thereafter. Upon detection of the peak signal PEAK_CH1 at point 54, the system and method determines a rate of change of the first signal channel following the peak detection and a rate of change of a second signal channel associated with a neighboring switch following peak detection. The rate of change of the first signal channel 50A is determined during a time period Δ time during which the signal 50A drops from the peak channel at point 54 to a signal level at point 56. According to one embodiment, the Δ time is a predetermined time less than 500 milliseconds, and more particularly of about 100 milliseconds, according to one example. During the 100 millisecond time delay, the first signal 50A drops by a value shown as DELTA CH1. The signal channel for each and every neighboring channel, such as second signal 50B is also monitored. One neighboring second signal channel 50B is shown by dotted lines rising up to a peak value and dropping. The second signal channel associated with the neighboring switch has a rate of change of signal during the delay time Δ time shown rising up from point 58 to point 60 shown as rate of change DELTA CH2. Thus, the system and method determines both a rate of change of the first signal channel 50A shown by delta channel CH1 and a rate of change of the neighboring second signal channel 50B shown as DELTA CH2 during time period Δ time, and uses the rate of change signal DELTA CH1 and DELTA CH2 to determine whether to activate the first switch associated with the first signal channel 50A. The system and method may make a decision as to whether to activate the first switch based on either of the rate of change of the first signal channel and the rate of change of the neighboring second signal channel or on a combination of both of the rate of change signals DELTA CH1 and DELTA CH2. In one embodiment, the system and method monitors each of the rate of change signals DELTA CH1 and DELTA CH2 and further sums up the absolute values of the signals DELTA CH1 and DELTA CH2 and compares the summed total to a sum threshold test value which may be based on a proportion or multiplication factor of the peak signal PEAK CH1 at point 54 of the current first signal channel. The multiplication factor may be 0.5 (or 50%), for example.

Figure 7:
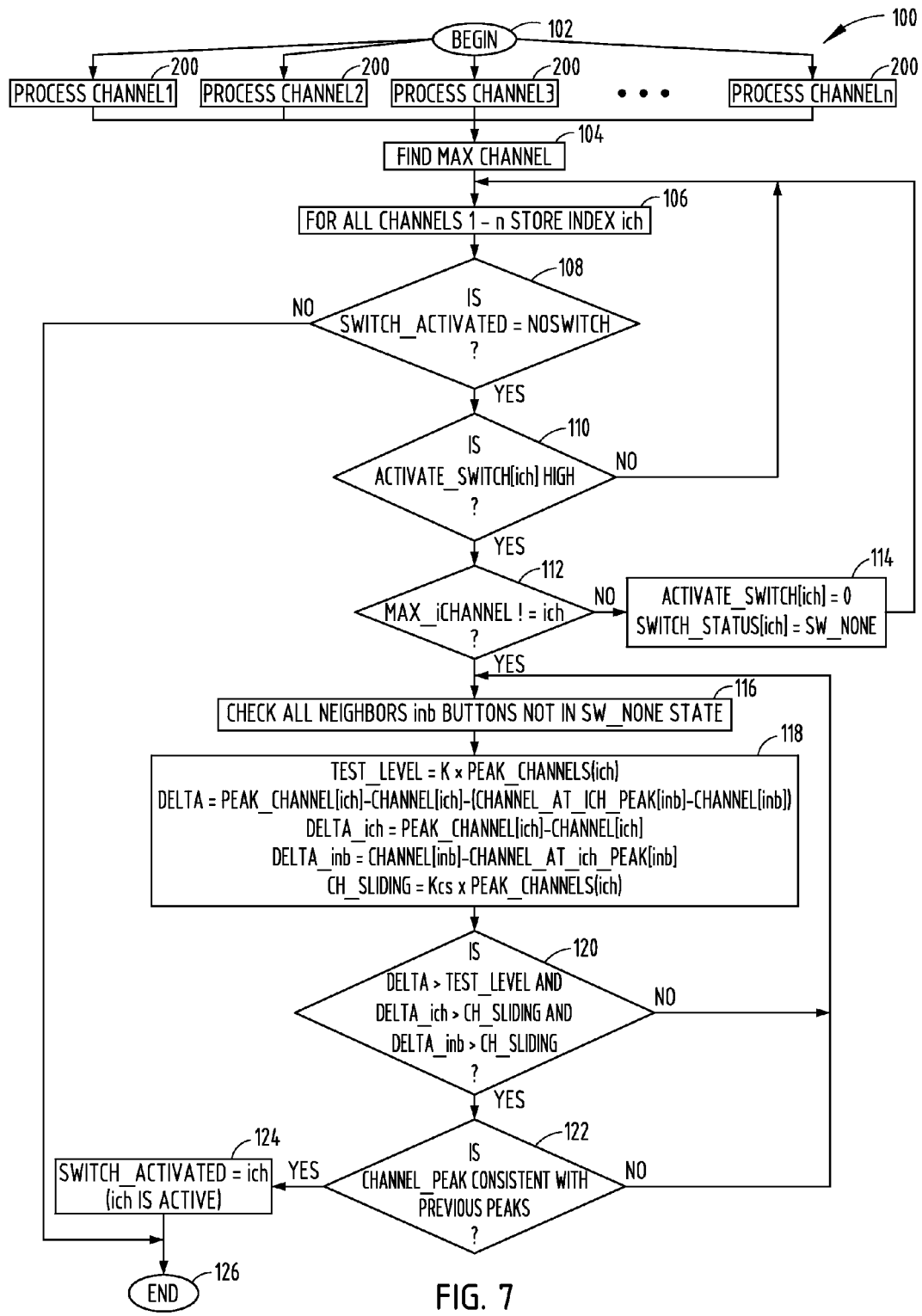
FIG. 7 is a flow diagram illustrating a routine for executing a method of activating a switch of the switch assembly, according to one embodiment.

A routine 100 for executing a method of activating a proximity switch of the proximity switch assembly is illustrated in FIG. 7, according to one embodiment. Method 100 begins at step 102 and proceeds to process the signal channel associated with each proximity switch of the switch assembly in each of blocks 200, which may occur with parallel processing. Next, method 100 proceeds to step 104 to monitoring the signal amplitude of each of the signal channels 1-n to find the maximum signal channel associated with one of the switches. At step 106, method 100 monitors the signal for all signal channels identified as ich 1 to n and stores the index values in memory. Next, at decision block 108, method 100 determines if there is a switch activated. If a switch is activated, method 100 ends at step 126. If none of the switches are activated, method 100 proceeds to decision step 110 to determine if the current switch (ich) is set to activate_switch and, if not, returns to step 106. If the current switch (ich) is set to activate_switch, method 100 proceeds to decision step 112 to determine if the maximum ichannel is equal to the index of channel ich and, if not, proceeds to step 114 to set the activate switch (ich) equal to zero and to set the switch status (ich) equal to the SW_NONE which is the state in which there is no sensor activity detected, before returning to step 106. If the maximum ichannel is set equal to the index of channel ich, method 100 proceeds to step 116 to check all neighboring switch buttons that are not in the SW_NONE state. Accordingly, any switches or buttons that have some sensor activity and all neighboring switches to the current switch having the current maximum signal channel are monitored. Proceeding to block 118, method 100 monitors the rate of change of the current signal channel associated with the current switch and each neighboring signal channel associated with each neighboring switch during a predetermined time period following the peak amplitude of the current channel. Included in block 118 is a calculation of test_level set equal to K×peak_channel (ich), where K is a multiplication factor such as 05, and calculation of channel_sliding set equal to Kcs×peak_channel (ich), where Kcs is a multiplication factor such as 0.1. Additionally, a value DELTA is determined which is a sum of the absolute values of DELTA ich and DELTA inb, where DELTA ich is the peak channel rate of change during the time delay, and DELTA inb is the rate of change of the signal channel of the neighboring channel when the peak of the current signal channel is detected minus the signal channel of the neighboring channel at the end of the time period Δ time. Method 100 then proceeds to decision step 120 to make the following decisions: determine if DELTA is greater than a test level; and determine if DELTA_ich is greater than channel_sliding; and determine if DELTA_inb is greater than channel_sliding. If any of the three conditions in decision block 120 are no, routine 100 returns to step 116. If all of the conditions set forth in decision block 120 are yes, routine 100 proceeds to decision block 122 to determine if the channel peak is consistent with the previous peaks and, if so, sets the current switch ich to active state at step 124 before ending at step 126. Otherwise, method 100 returns to step 116. Accordingly, method 100 determines whether or not to activate the current signal channel based on at least one of the rate of signal change of the current switch channel and rate of change of the neighboring switch channel(s).

Figure 8:
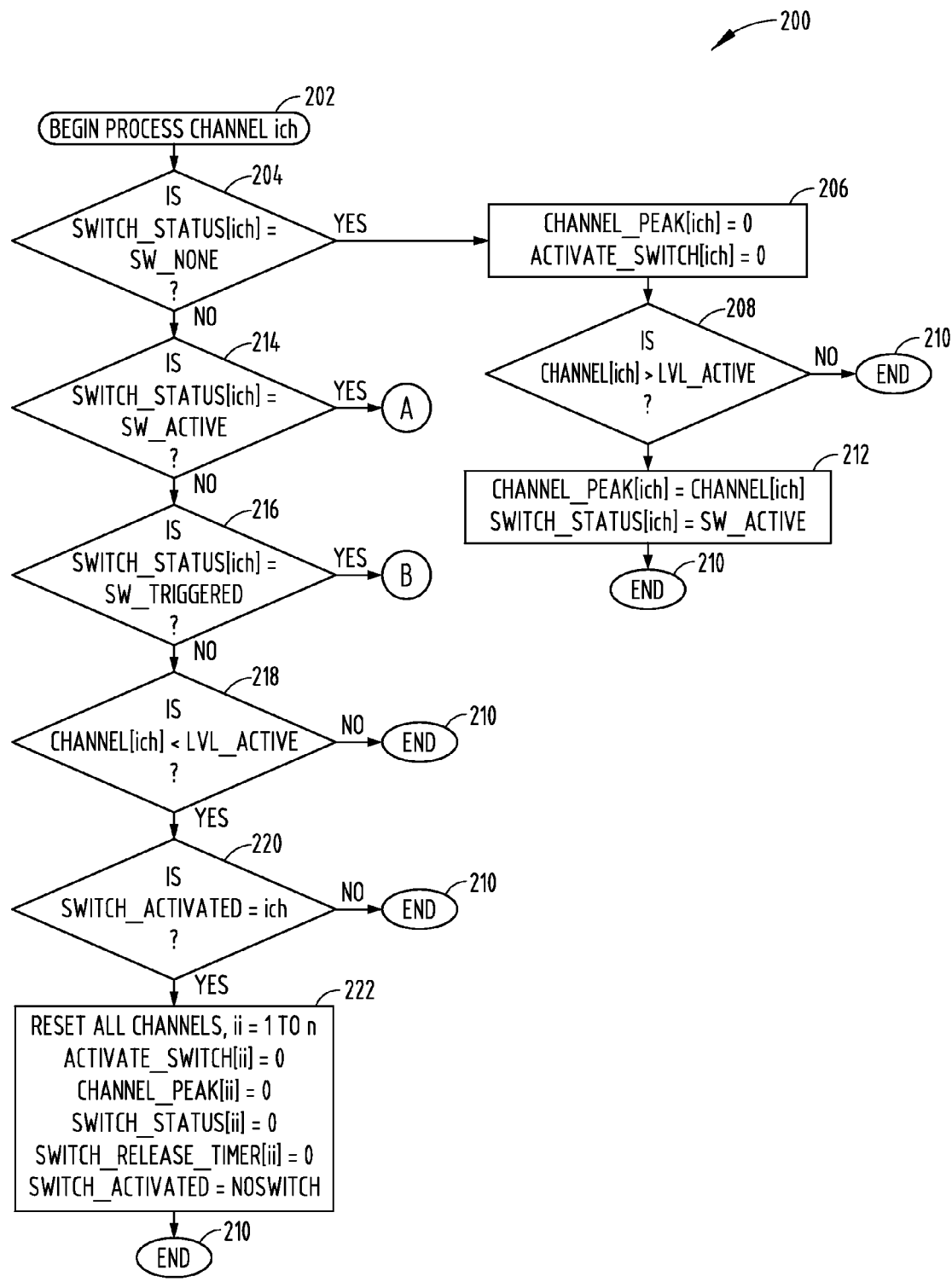
FIGS. 8-8B are flow diagrams illustrating the processing of the switch activation and switch release.
Figure 8A:
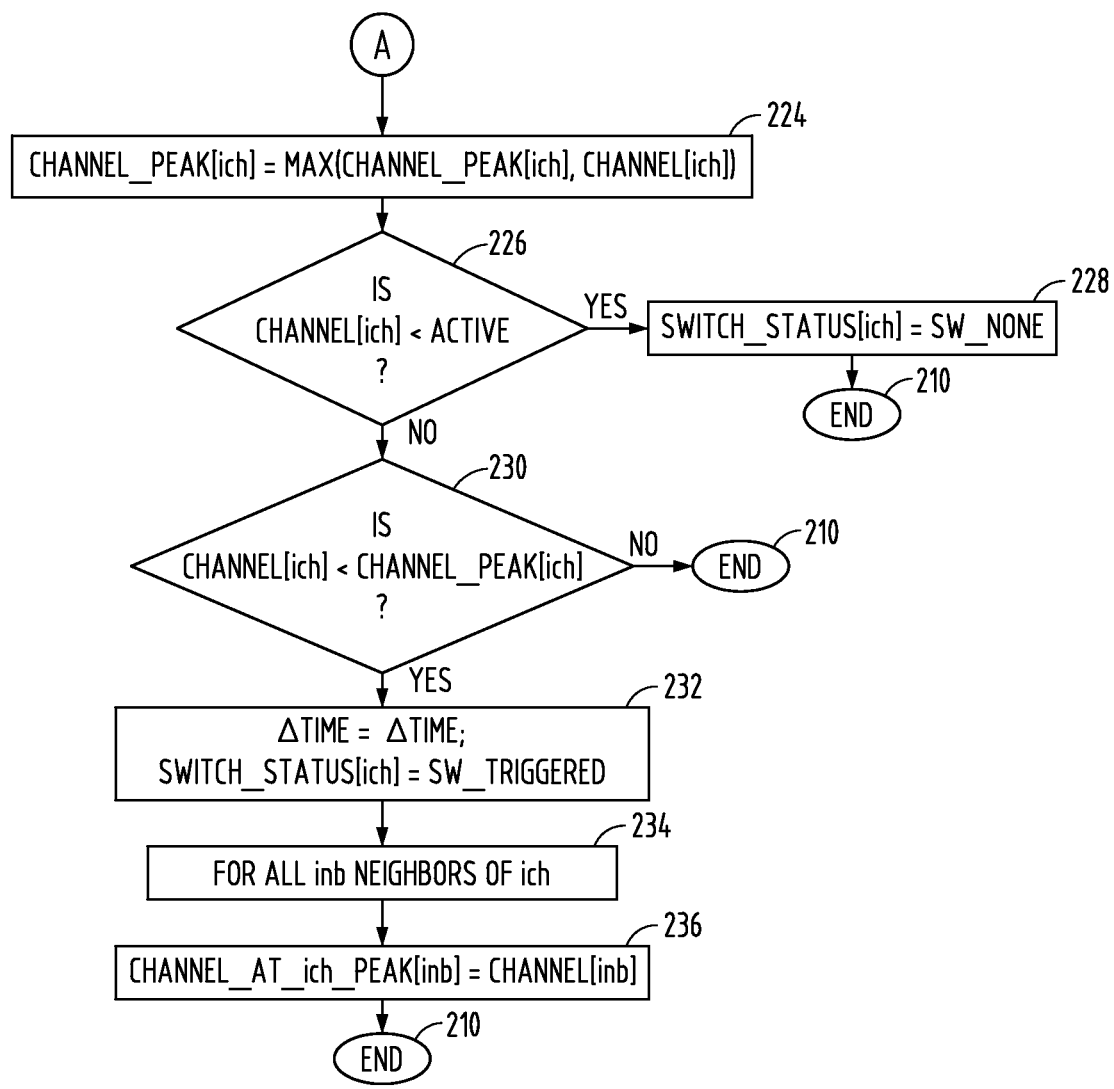
Figure 8B:
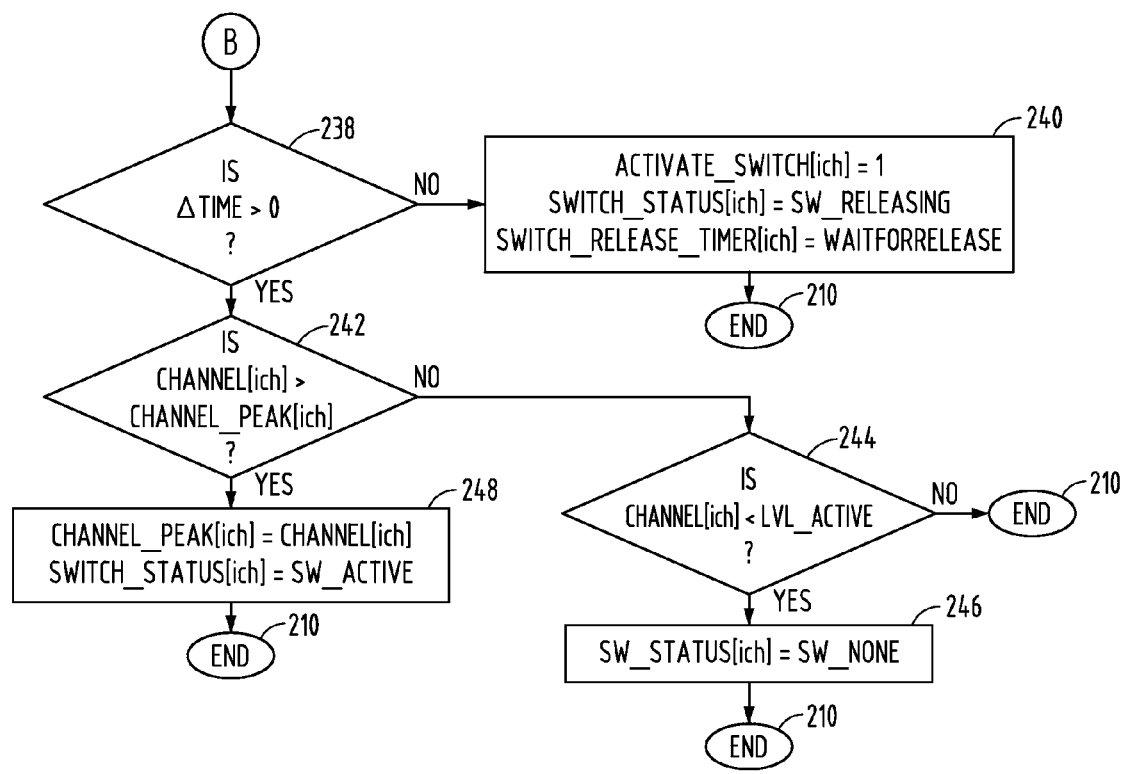

Referring to FIGS. 8-8B, the processing of the individual signal channels associated with the plurality of switches is illustrated, according to one embodiment. Routine 200 begins at step 202 to process the current channel ich and proceeds to decision step 204 to determine if the switch status (ich) is set equal to the SW_NONE state and, if so, proceeds to step 206 to set the channel peak (ich) equal to zero and sets the activate_switch (ich) equal to zero. Routine 200 then proceeds to decision step 208 to determine if the current channel (ich) is greater than LVL_ACTIVE) and, if so, sets the channel peak (ich) equal to the current channel (ich); and further sets the switch status (ich) equal to the switch_active. The switch_active state is the state in which activity as determined by the sensor is high enough to warrant activation, hunting/exploration, or casual motion of the switch assembly.

Returning to decision step 204, if the current switch status (ich) is not equal to the SW_NONE state, then routine 200 proceeds to decision step 214 to determine if the switch status (ich) is equal to the switch_active state which is the state in which some activity is detected by the sensor, but not though to trigger activation of the switch at that point in time. If the switch is in the switch_active state, routine 200 proceeds to step 224 shown in FIG. 8A to set the channel peak (ich) equal to the maximum value. Next, at decision step 226, routine 200 determines if the current channel (ich) is less than LVL_ACTIVE and, if so, proceeds to step 228 to set the switch status equal to the SW_NONE state, before ending at step 210. If the channel is not less than LVL_ACTIVE, routine 200 proceeds to decision step 230 to determine if the channel is less than the channel peak and, if not, ends at step 210. If the channel is less than the channel peak, routine 200 proceeds to step 232 to set the Δ time equal to Δ time and to further set the switch status equal to the switch_triggered state. The switch_triggered state is the state in which the switch button is considered for activation after a time Δ. Next, at step 234, routine 200 looks for all inb switch neighbors of current switch ich, and then proceeds to step 236 to set the neighboring channel (inb) to the channel at ich peak (inb), before ending at step 210.

Returning to FIG. 8, if the switch status is not equal to the switch_active state in decision step 214, routine 200 proceeds to decision step 216 to determine if the switch status is equal to the switch_triggered state and, if so, proceeds to decision step 238 in FIG. 8B. In decision step 238, routine 200 determines if the Δ time is greater than zero and, if not, proceeds to step 240 to set Activate_Switch equal to one; to set Switch_Status equal to Switch_Releasing; and to set the Switch_Release_Timer equal to Waitforrelease, before ending at step 210. If the Δ time is greater than zero, routine 200 proceeds to decision step 242 to determine if the current channel ich is greater than the channel peak (ich) and, if so, sets the channel peak (ich) equal to current channel and sets the switch status equal to switch_active at step 248, before ending at step 210. If the signal is not greater than the signal peak, routine 200 proceeds to decision step 244 to determine if the channel is less than LVL_ACTIVE and, if so, sets the switch status equal to SW_NONE state at step 246, before ending at step 210. If the channel is not less than LVL_ACTIVE, routine 200 ends at step 210.

Returning to decision step 216 in FIG. 8, if the switch status is not equal to the switch_triggered state, routine 200 proceeds to decision step 218 to determine if the channel is less than the LVL_ACTIVE and, if not, ends at step 210. If the channel is less than LVL_ACTIVE, routine 200 proceeds to decision step 220 to determine if the switch activated is equal to ich and, if not, ends at step 210. If the switch activated is set equal to ich, routine 200 proceeds to step 222 to reset all channels ii=1-n; to set the Activate_Switch equal to zero; to set Channel_Peak equal to zero; to set Switch_Status equal to zero; to set Switch_Release_Timer equal to zero, and to set Switch_Activated equal to no switch before ending at step 210. It should be appreciated that routine 200 may be repeated for each of the signal channels 1 through n and employed in routine 100.

Accordingly, the determination routine advantageously determines activation of the proximity switches based on a first signal and a rate of change of the first signal associated with a first proximity switch and rate of change of a second signal associated with a neighboring second switch. It should be appreciated that all neighboring switches may be monitored to determine activation of a switch. The routine advantageously allows for a user to explore the proximity switch pads which can be particularly useful in an automotive application where driver distraction can be avoided.

It is to be understood that variations and modifications can be made on the aforementioned structure without departing from the concepts of the present invention, and further it is to be understood that such concepts are intended to be covered by the following claims unless these claims by their language expressly state otherwise.

We claim:

1. A method of operating a proximity switch comprising:
    detecting a first signal associated with a first proximity switch for performing a first function and a second signal associated with a separate neighboring second proximity switch for performing a second function;
    determining with a controller a first rate of change of the first signal and a second rate of change of the second signal; and
    performing the first function of the first switch based on both the first rate of change and the second rate of change.

2. The method of claim 1 further comprising the step of detecting a peak amplitude of the first signal, wherein the first rate of change of the first signal and the second rate of change of the second signal is determined following the peak amplitude detection.

3. The method of claim 1 further comprising the step of entering an exploration mode when the first rate of change of the first signal and the second rate of change of the second signal are greater than a threshold.

4. The method of claim 1, wherein the method determines activation of the first signal when at least one of the first rate of change of the first signal and second rate of change of the second signal is less than a threshold value.

5. The method of claim 1 further comprising the step of summing an absolute value of the first rate of change of the first signal and an absolute value of the second rate of change of the second signal, comparing the summed value to a sum threshold value, and performing the first function of the first switch when the summed value is less than the sum threshold value.

6. The method of claim 1, wherein the first rate of change of the first signal is determined during a predetermined time period following detection of the peak amplitude, and the determination of second rate of change of the second signal is determined during the predetermined time period.

7. The method of claim 6, wherein the predetermined time period is less than 500 milliseconds.

8. The method of claim 1, wherein a plurality of activation fields are generated for a plurality of proximity sensors associated with a plurality of proximity switches, and wherein the largest amplitude signal associated with the plurality of activation fields is processed to determine performing a function of one of the proximity switches.

9. The method of claim 1, where the proximity switch is installed on a vehicle for use by a passenger in the vehicle.

10. The method of claim 1, wherein the proximity switch comprises a capacitive switch comprising one or more capacitive sensors.

11. A proximity switch assembly comprising:
    a plurality of proximity switches each comprising a proximity sensor for providing a sense activation field; and
    control circuitry processing the activation field of each proximity switch, detecting a first signal associated with a first proximity switch for performing a first function and a second signal associated with a separate neighboring second proximity switch for performing a second function, determining a first rate of change of the first signal and second rate of change of the second signal, and performing the first function of the first switch based on both the first rate of signal change and the second rate of change.

12. The proximity switch assembly of claim 11, wherein the control circuitry further detects a peak amplitude of the first signal and determines the first rate of change of the first signal and the second rate of change of the second signal following the peak amplitude detection.

13. The proximity switch assembly of claim 12, wherein the determination of the first rate of change of the first signal and the second rate of change of the second signal occurs within a predetermined time period of less than 500 milliseconds.

14. The proximity switch assembly of claim 11, wherein the control circuitry enters an exploration mode when the first rate of change of the first signal and the second rate of change of the second signal are greater than a threshold.

15. The proximity switch assembly of claim 11, wherein the control circuitry sums an absolute value of the first rate of change of the first signal and an absolute value of the second rate of change of the second signal, compares the summed value to a sum threshold value, and performs the first function of the first switch when the summed value is less than the sum threshold value.

16. The proximity switch assembly of claim 11, wherein the proximity switch is installed on a vehicle for use by a passenger in the vehicle.

17. The proximity switch assembly of claim 11, wherein the proximity switch comprises a capacitive switch comprising one or more capacitive sensors.

* * * * *